US006271462B1

(12) United States Patent
Tsuzuki et al.

(10) Patent No.: US 6,271,462 B1
(45) Date of Patent: Aug. 7, 2001

(54) INSPECTION METHOD AND PRODUCTION METHOD OF SOLAR CELL MODULE

(75) Inventors: Koji Tsuzuki, Ikoma; Tsutomu Murakami; Takehito Yoshino, both of Nara; Yoshifumi Takeyama, Kyoto; Koichi Shimizu, Kyotanabe, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/470,211

(22) Filed: Dec. 22, 1999

(30) Foreign Application Priority Data

Dec. 25, 1998 (JP) .................................................. 10-370497
Dec. 15, 1999 (JP) .................................................. 11-356601

(51) Int. Cl.$^7$ .......................... H01L 31/042; H01L 31/18
(52) U.S. Cl. .......................... 136/290; 136/293; 136/256; 136/244; 136/251; 438/57; 438/64; 438/66; 438/67; 438/80
(58) Field of Search ........................ 136/290, 293, 136/259, 244, 251; 438/57, 64, 66, 67, 80

(56) References Cited

U.S. PATENT DOCUMENTS

| 4,301,409 | * | 11/1981 | Miller et al. | 324/537 |
| 5,679,176 | * | 10/1997 | Tsuzuki et al. | 136/251 |
| 6,072,115 | * | 6/2000 | Inoue et al. | 136/244 |
| 6,154,034 | * | 11/2000 | Lovelady et al. | 324/501 |

FOREIGN PATENT DOCUMENTS

| 797100 | * | 9/1997 | (EP) . |
| 5-157820 |   | 6/1993 | (JP) . |
| 5-257107 |   | 10/1993 | (JP) . |
| 7-45673 |   | 2/1995 | (JP) . |
| 10-326902 | * | 12/1998 | (JP) . |
| 12-88726 | * | 3/2000 | (JP) . |

* cited by examiner

*Primary Examiner*—Alan Diamond
(74) *Attorney, Agent, or Firm*—Fitzpatrick, Cella, Harper & Scinto (57) ABSTRACT

By inspecting an electrical wiring route of a solar cell module while applying a load to the solar cell module, it is possible to more accurately judge the presence or absence of a defect in the electrical wiring route of the solar cell module.

26 Claims, 4 Drawing Sheets

INSPECTION METHOD AND PRODUCTION METHOD OF SOLAR CELL MODULE

BACKGROUND OF THE INVENTION

1. Field of the Invention

The present invention relates to inspection and production methods of a solar cell module. In particular, the present invention relates to an inspection method of an electric wiring route in a solar cell module and to a production method for a solar cell module which includes an inspection method step.

2. Related Background Art

In recent years, a global warming tendency has come to be expected due to a greenhouse effect in light of increased $CO_2$. Accordingly, there has been a growing desire for clean energy free of $CO_2$ emission. An energy source free of emission of $CO_2$ includes nuclear power generation. However, problems with radioactive waste have not yet been solved, and safer, clean energy is expected. In such a circumstance, in particular, a solar cell which is one of the clean energies is remarkable in terms of its cleanliness, safety, and ease of treatment. In particular, a method of installing such a solar cell on a housing's roof, a wall, and a sound insulating wall of an express highway, thereby using it as a power source, is very highly anticipated.

As types of solar cells, there have been researched and developed various solar cells including a crystalline solar cell, an amorphous solar cell, and a compound semiconductor solar cell. Among these solar cells, an amorphous silicon solar cell is inferior to a crystalline solar cell in conversion efficiency, but has superior features, such as easy extension of area, large optical absorption coefficient, and thin film operation, that the crystalline solar cell does not have. This is one of the promising solar cells of the future.

Figure 2A:
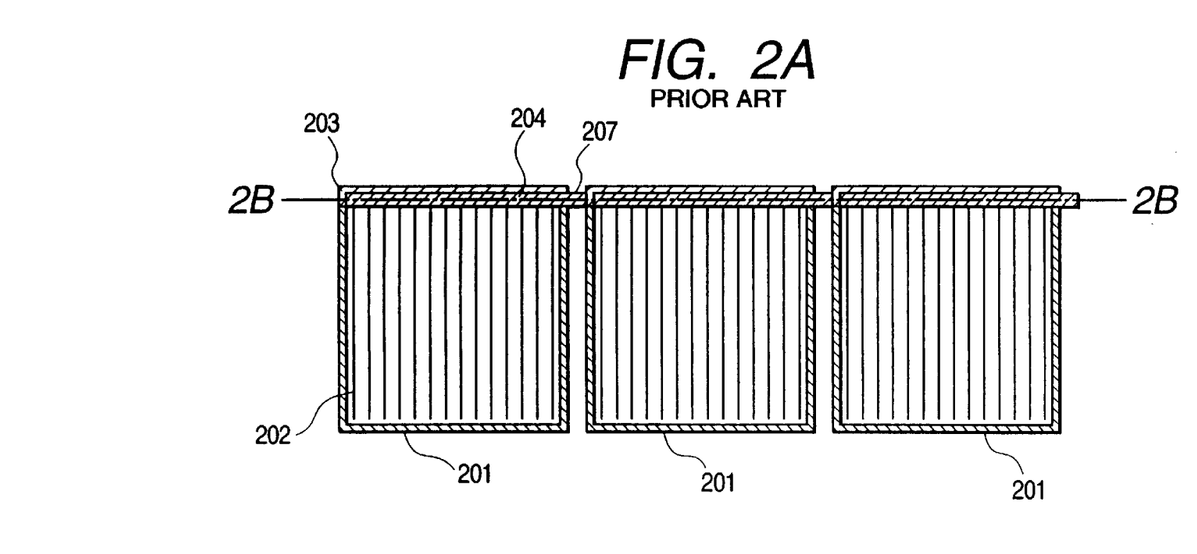
FIG. 2A is a schematic view showing an example of a solar cell module.
Figure 2B:
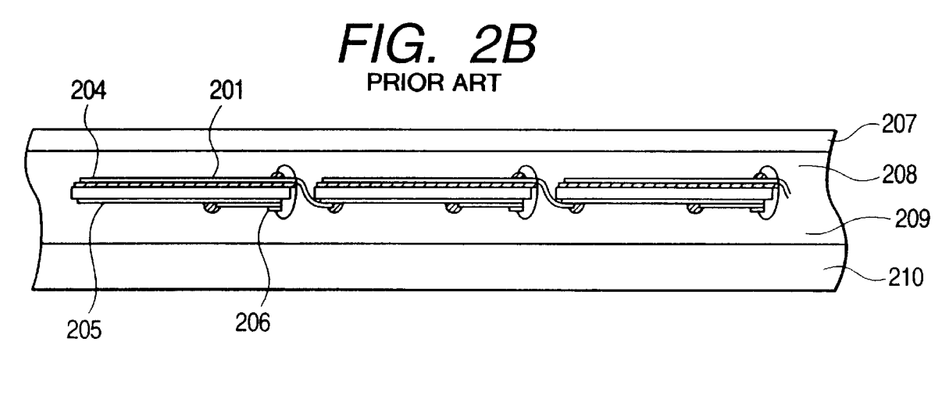
FIG. 2B is a schematic sectional view taken along the line 2B—2B of FIG. 2A.

FIG. 2A and FIG. 2B are schematic views showing an example of a solar cell module.

Reference numeral 201 denotes a solar cell element that has a semiconductor layer, an electrode on a light incidence side, and an electrode on a back surface side. A current collecting electrode 202 is further provided at the element on the light incidence side, and a bus bar electrode 204 is provided at an end of the electric collecting electrode 202 for further electric collection. An insulating member 203 for preventing an electric short-circuit at an edge of the solar cell element is provided between a bus bar electrode 204 and a solar cell element 201. The bus bar electrode 204 has an extension portion 207 projected from the solar cell element 201. The extension portion is connected to a back surface side electrode 205 of the solar cell element adjacently disposed, whereby the solar cell element 201 is electrically connected, and is connected in a desired number.

Figure 5A:
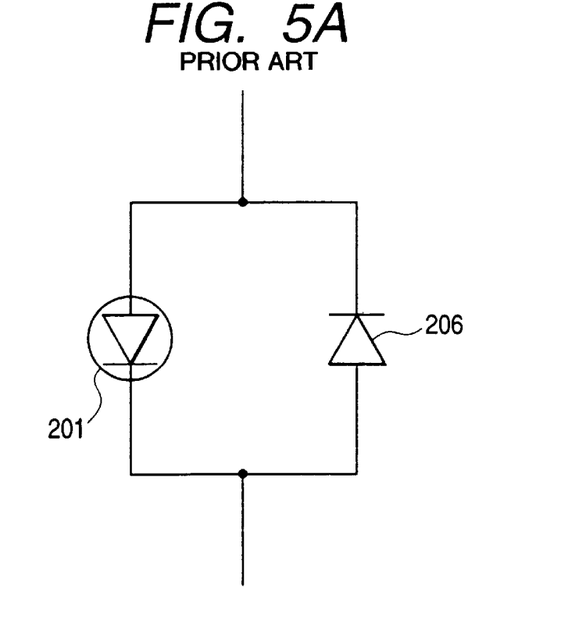
FIGS. 5A and 5B are circuit diagrams showing examples of the by-pass diode used in the present invention.
Figure 5B:
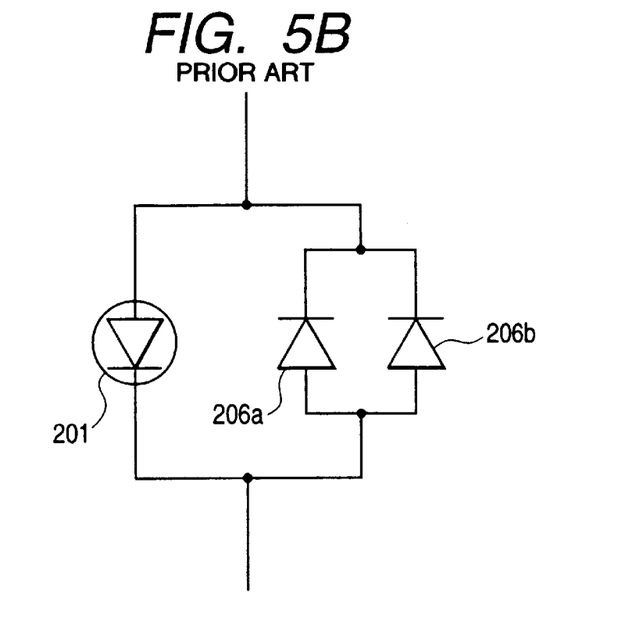

In addition, a by-pass diode 206 having by-pass functions by the respective solar cell elements 201 may be provided so as not to damage a solar cell element itself in the case where the solar cell module is hidden or the like. As such a by-pass diode, a simple diode, for example, having a chip diode sandwiched between two metallic foils or the like is employed to maintain module plane properties. The by-pass diode 206 is connected in opposite parallel to the solar cell element 201 so that the current flowing through the solar cell element can be by-passed as shown in FIG. 5A. The connection portion includes the back surface side of the solar cell element 201, for example, that is connected to the back surface side electrodes 205 by means of solder material or the like. As shown in FIG. 5B, a parallel body of by-pass diodes 206a and 206b may be connected in reverse parallel to the solar cell element 201.

The thus connected solar cell element in desired number is encapsulated and covered with a resin or the like to make it endure in outdoor use. FIG. 2B is a schematic cross-section taken along line 2B—2B of FIG. 2A. The solar cell element 201 is disposed between a surface member 207 and a back surface member 210, and a surface encapsulating material 208 and a back surface encapsulating material 209 are intervened to bond and encapsulate the respective materials, whereby the solar cell module is constituted. As the surface member 207, a glass plate having light transmissive properties or a fluorine-containing resin film is suitably employed; and as the back surface member 210, a steel sheet, a metallic sheet, or a resin film or the like is suitably employed. In addition, the surface encapsulant material 208 and the back surface encapsulant 209 require characteristics such as transparency, weather resistance, high adhesion and the like. Thus, EVA is generally used as a material that meets the requirement. When the back surface member 210 is metallic, a layer insulating film such as PET may be provided in the back surface encapsulating material 209 in order to ensure insulation properties with the solar cell 201 and back surface member 210. As a method for encapsulation with a resin, a heat and pressure bonding method is adopted, and specifically, vacuum lamination or roll lamination or the like that is conventionally known can be variously selected and employed.

To ascertain the presence or absence of a defect in the solar cell module, it is typical to inspect the presence or absence of a failure of an electric wiring route in the solar cell module up until the resin encapsulation. The inspection includes, for example, ascertaining the presence or absence of a failure (or defect) of the electric wiring route in the solar cell module due to the failure of a solar cell element itself or by-pass diode itself or the like, or due to a failure of the electric wiring route in the solar cell module due to a connection failure of the electric connection portion in the solar cell module.

However, in a general inspection method for inspecting the solar cell module through inspection of the photoelectric conversion efficiency of the solar cell module or functionality of a by-pass diode and the conducting state of the electric wiring route in the solar cell module, it may be impossible to ascertain the presence or absence of the failure of the solar cell module. Such examples are shown as follows:

(1) a failure of connection at a connection portion between the expansion portion 207 of the bus bar electrode 204 of one solar cell element 201 and the back surface electrode 205 of the other adjacent solar cell element;

(2) a failure of connection between the electric collecting electrode 202 and the bus bar electrode 204; and (3) disconnection of the by-pass diode 206, for example, disconnection due to cracks or the like of diode chips or slip-off of the metal foil terminal of the by-pass diode 206 and chip diode.

For a failure of connection stated above, in a resin-encapsulated solar cell module, it may be impossible to ascertain the presence or absence of failures of the electric wiring route in the solar cell module with the above general inspection method. This is because the periphery of the electric wiring route including solar cell element, by-pass diode or the like is encapsulated with a resin by using the resin encapsulating process; thus an electrical contact occurs with even a portion at which connection failure occurred in the electric wiring route, as if the route is conducting, and the inspection result is shown as if the solar cell module were acceptable.

In addition, even if an acceptable solar cell element or by-pass diode or the like is employed, there may be damaged parts during transportation in the production process or there may be damaged parts during a resin encapsulating process. Further, even if an adjacent solar cell element is acceptablely connected by means of a bus bar electrode, a bus bar electrode or the like may slip off accidentally due to the dead weight or distortion of the solar cell element or the like when they are transported. A large area for the solar cell element is generally employed as a large area device, and thus, an area for a serial body of the solar cell element 201 is increased as shown in FIG. 2A, for example. Therefore, while such a serial body is transported during the production process, the solar cell element 201, bus bar element 204, and the extension portion 207 of the bus bar electrode are likely to slacken, and a connection portion between the bus bar electrode extension portion 207 and the adjacent solar cell element 201 or a connection portion of the by-pass diode 206 or the like may slip off. Further, a metal foil terminal of the by-pass diode and a chip diode may be damaged during transportation. In such a case, when resin encapsulation is performed, the periphery of the electric wiring route is encapsulated with a resin. Thus, even a portion at which a connection failure occurs may seem to be conducting. Therefore, even if the presence or absence of failures of the electric wiring route in the solar cell module is inspected after resin encapsulation, it may be impossible to ascertain the presence or absence of the failures of electric wiring in the solar cell module with the above general inspection method.

Furthermore, after resin encapsulation, the periphery of the electric wiring route including solar cell element, by-pass diode, bus bar or the like is encapsulated with resin, and thus, a tester cannot be applied to each portion of the electric wiring route.

In such a solar cell module, because of a connection failure of its electric wiring route, even if the route appears to be conducting, a contact failure occurs due to oxidization degradation while in long outdoor use, and its inherent output may be compromised.

Thus, it is not easy to inspect the solar cell module after resin encapsulation because of a structure specific to the solar cell module or a production process specific to the resin encapsulation process of the solar cell module or the like.

SUMMARY OF THE INVENTION

The present invention has been accomplished in light of the above-mentioned problems.

An object of the present invention is to provide an inspection method that can detect a connection failure (or defect) resulting from the structure of a solar cell module or a production process thereof and possibly existing in an electrical wiring route of the solar cell module and to provide a method of producing a solar cell module comprising the inspection step. Specifically, an object of the present invention is to provide an inspection method that can detect a connection failure in an electrical wiring route of a solar cell module comprised of a solar cell element, a by-pass diode, a bus bar electrode, and so on by inspecting the conducting state of the electrical wiring route even when the route appears to be conducting, and a method of producing a solar cell module comprising the inspection step.

According to a first aspect of the present invention, there is provided a method of inspecting an electrical wiring route of a solar cell module comprising a solar cell element, which comprises the step of inspecting an electrical wiring route of a solar cell module while applying a load to the solar cell module.

According to a second aspect of the present invention, there is provided a method of producing a solar cell module comprising the above-mentioned inspection step.

The present invention having the above-mentioned feature makes it possible to easily detect a connection failure in an electrical wiring route of a solar cell module and to judge whether the solar cell module is acceptable or defective even when the route appears to be conducting. Especially, the technical benefit of the inspection method and production method of the present invention is more remarkable when the solar cell module is encapsulated with a resin.

DETAILED DESCRIPTION OF THE PREFERRED EMBODIMENTS

The present inventive inspection method, which solves the above-mentioned problems, was developed as a result of the inventors' earnest research and development efforts. Specifically, the following is achieved by the above configuration of the present invention.

(1) According to the present invention, a solar cell module is inspected with a load applied thereto, instead of being inspected as is. In this way, a connection failure or the like stated in the above problems can be detected.

That is, a load is applied to the solar cell module, whereby the solar cell module is deflected. If the module is deflected, there is no problem with a portion at which electric wiring is acceptably connected. However, at a portion at which wiring appears to be conducting and an electrical contact just happens to occur, a contact area is changed depending on its distortion amount or a non-contact state occurs. Thus, the inspection results may be different from each other before and after the load is applied. Detecting this difference makes it possible to detect failures that have not been detected conventionally.

(2) According to the present invention, a change in the above contact area or a change in electric resistance at a defective portion of electric wiring in case of a non-contact state occurs. Thus, characteristics such as a voltage generated when a current is supplied in the forward direction of the by-pass diode or solar cell element or a current generated when a voltage is applied in the forward direction of the by-pass diode or solar cell element are measured, thereby enabling detection.

(3) According to the present invention, a temperature generated in the solar cell module, preferably in the electrical wiring route and more preferably in the by-pass diode or solar cell element, when a current is supplied in the forward direction of the by-pass diode or solar cell element is measured, thereby making it very effective especially to employ two or more by-pass diodes when they constitute a parallel circuit, for example. More specifically, as shown in FIG. 5B, two by-pass diodes 206a and 206b are connected to one solar cell element 201. When a connection failure occurs with one of these by-pass diodes, i.e., only the bypass diode 206a, another acceptable by-pass diode 206b functions during the above current measurement or voltage measurement. Thus, the sensitivity of detection is impaired, and connection failure occasionally cannot be detected. However, according to temperature measurement when a current is supplied to the by-pass diode, a temperature does not rise at one of these two by-pass diodes, thus enabling detection of failures. Inspection with temperature measurement is performed with a load being applied to the solar cell module, whereby one or more by-pass diodes having a connection failure, which is conductive while a load is not applied, can be found. Even in a case where two or more solar cell elements construct a parallel circuit, a forward current is supplied to the solar cell element, whereby a failure of electric wiring routed through the solar cell element can be detected.

(4) According to the present invention, the solar cell module is irradiated with light, whereby a voltage is generated, and the generated voltage is changed by a contact failure due to the application of the load. Thus, the generated voltage is measured, thereby enabling detection of failures.

(5) According to the present invention, a load is applied from a light receptive free surface side of the solar cell module, thereby making it possible to inspect characteristics without damaging any light receptive surface side.

(6) Further, according to the present invention, a load is defined as a torsional load, whereby a change in contact area or a non-contact state becomes more significant, and detection of failures can be measured with higher sensitivity.

Hereinafter, aspects of the inspection method according to the present invention will be described in more detail.

Figure 1A:
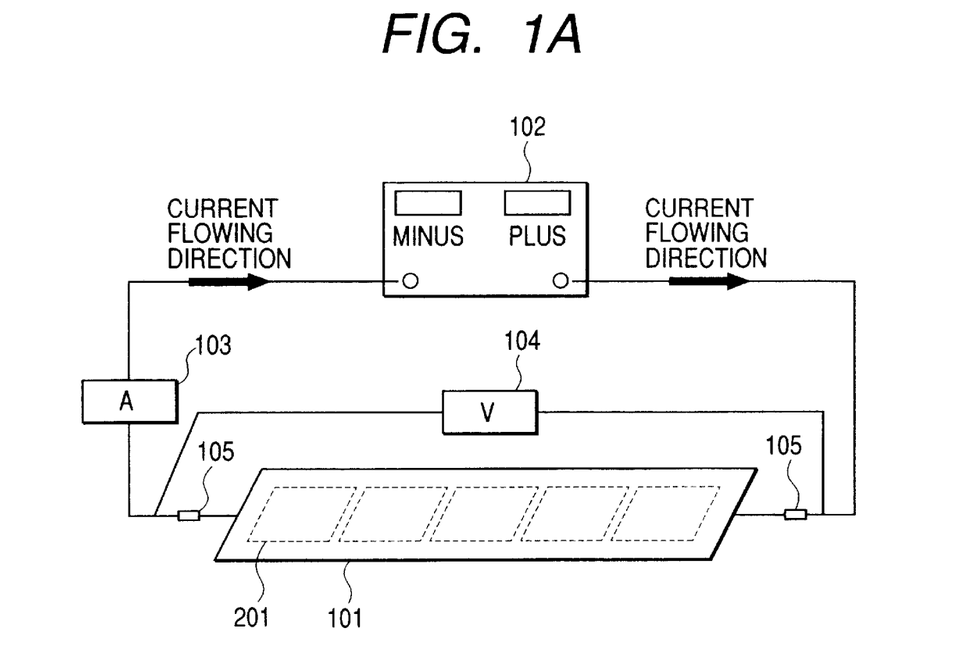
FIGS. 1A and 1B are schematic views showing examples of the inspection method of the present invention.
Figure 1B:
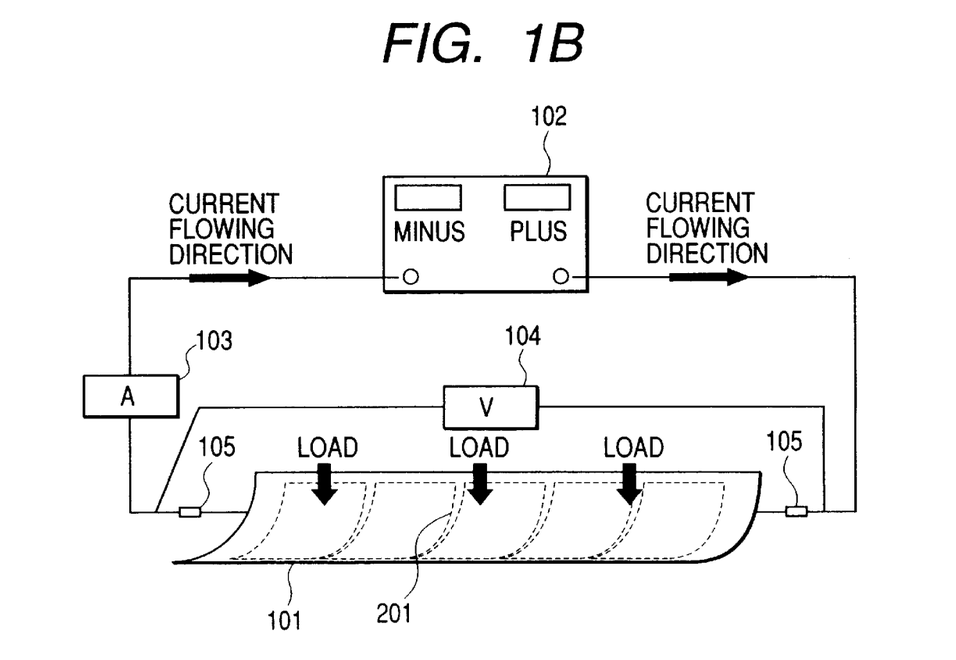

FIG. 1A and FIG. 1B are schematic views showing an inspection method according to the present invention. FIG. 1A shows a state in which no load is applied; and FIG. 1B shows a state in which a load is applied. Reference numeral 101 denotes a solar cell module; reference numeral 102 denotes a constant current voltage power source; reference numeral 103 denotes an ammeter; and reference numeral 104 denotes a voltmeter. A constant current voltage power source 102 is wired so that a predetermined current or voltage can be applied to the solar cell module 101. An ammeter 103 is disposed in series part-way of its circuit. In addition, a voltmeter 104 is wired in parallel so that the voltages at both ends of the solar cell module 101 can be measured. Reference numeral 105 denotes a connector.

It is preferable that the solar cell module 101 according to the present invention has flexibility so that the module can be properly deformed. In each of FIG. 1A and FIG. 1B, there is shown an example relative to the solar cell module in which five solar cell elements are connected in series. Measurement is possible regardless of the number of circuits in series or in parallel. As a solar cell element 201, an amorphous silicon solar cell element, a thin-film crystalline silicon solar cell element or the like can be employed. In addition, a solar cell element employing a semiconductor other than silicon can be employed. Further, a layer configuration of the solar cell element is not limited in particular. For example, any layer configuration such as a double- or triple-layer configuration of amorphous PIN, a stacked structure of the crystalline semiconductor layer and amorphous semiconductor layer can also be applied.

FIG. 1B is a view showing an example of a state when a load is applied. The load is applied to an extent such that the solar cell module is properly deformed or deflected. When the load is increased in scale, the sensitivity of inspection is improved. If the load is excessively great, there is a possibility that the solar cell module is plastically deformed. Thus, it is preferable that the load is as large as possible within the limit of elasticity. Of the electric wiring route, if a load is applied so that deflection at a portion at which there occur contact failures at high probability is increased, detection of failures is further facilitated.

It is preferable to employ a method for applying a load from the back surface side of the solar cell module so as not to damage a light incident surface side of the solar cell element.

In addition, the orientation of load is not limited to one direction and may be applied in several directions. For example, a load may be applied in a direction such that the solar cell module is distorted to increase the sensitivity of detecting characteristics, for example.

Now, a description of inspection will be given in detail.

In inspection, a constant voltage power source 102 having its sufficient capacity with respect to a solar cell module to be measured is prepared. In addition, as shown in FIG. 1A and FIG. 1B, an ammeter 103 and a voltmeter 104 are wired to each other, and a predetermined current or voltage is measured, thereby making it possible to perform inspection. The inspection is not limited thereto. If a failure such as connection failure occurs, a resistance value at a defective portion is changed in a state shown in each of FIG. 1A and FIG. 1B. Thus, a current value or a voltage value is measured, thereby making it possible to detect the presence or absence of failures.

In the case where two or more diodes configure a parallel circuit, when a current is supplied in the forward direction of these diodes, a method for measuring a temperature generated at these diodes is very effective. That is, when two or more diodes form a parallel circuit and only one of these diodes fails, the other acceptable diode functions during the above current or voltage measurement. Thus, detection sensitivity is impaired, and detection may be disabled.

On the other hand, where a temperature of a diode is measured when a current is supplied, heat generating properties are different depending on a defective diode and an acceptable diode, and thus, a failure can be detected precisely. At this time, in a known temperature measurement method, there can be employed a known technique in which a thermocouple is installed in the vicinity of a diode to be measured, and a radiation temperature meter is employed, thereby enabling measurement. As described above, such a diode includes a by-pass diode or a solar cell element or the like. The solar cell module itself generates a voltage by light emission.

Thus, a voltage generated by such light emission is measured, thereby enabling detection of failures.

Figure 3:
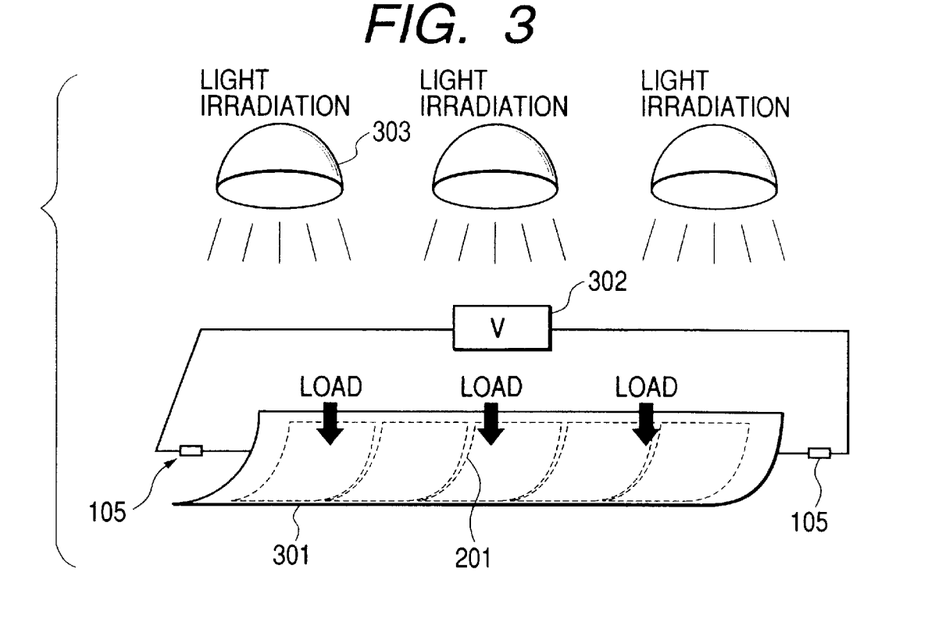
FIG. 3 is a schematic view showing another example of the inspection method of the present invention.

FIG. 3 is a schematic view showing the inspection method. Reference numeral 301 denotes a solar cell module; reference numeral 302 denotes an ammeter; and reference numeral 303 denotes an illumination. While light is emitted, a voltage is measured, whereby the generated voltage can be detected in the case where an electric wiring route is acceptable. However, in the case where a contact failure exists, its contact is removed due to the application of a load, whereby a voltage is not detected, thus making it possible to detect failures. A light source having its wavelength sensitivity of the solar cell element can be used properly.

Hereinafter, the present invention will be described by way of examples without being limited thereto.

EXAMPLE 1

First, an amorphous solar cell module as shown in FIG. 2A and FIG. 2B was fabricated. The fabrication procedure will be described by referring to FIG. 2A and FIG. 2B. Reference numeral 201 denotes a 300 mm×280 mm solar cell element including a substrate, a lower electrode layer, amorphous silicon having a photovoltaic function, and an upper electrode layer. Here, stainless steel 150 μm thick was employed as a substrate for supporting the entire solar cell element. Immediately on the substrate, the lower electrode layer was formed by sequentially laminating Al and ZnO in some thousands of Å (hundreds of nm), respectively by means of a sputtering technique. In addition, amorphous silicon was formed by sequentially depositing each of the layers of n-type, i-type, p-type, n-type, i-type, p-type, n-type, i-type, and p-type from the substrate side by means of a plasma CVD technique. In addition, the upper electrode layer is a transparent electrode film. In is evaporated by resistance heating technique in an $O_2$ atmosphere, and an indium oxide thin film about 700 Å (70 nm) thick was formed.

In order to prevent an adverse influence such as a short-circuit between the substrate and the transparent element film generated during peripheral cutting of the solar cell element, an etching paste including $FeCl_3$, $AlCl_3$ or the like on the transparent electrode film was applied to the thus prepared solar cell element by means of screen printing, was heated, and was washed, whereby a part of the transparent electrode film of the solar cell element was reduced in a linear pattern, and an etching line (not shown) was formed.

Then, a soft copper foil 205 7.5 mm in width, 285 mm in length, and 100 μm thick that is a back surface side power output member on a side of the back surface side end of the solar cell element 201 was connected to a conductive substrate using laser welding.

Thereafter, a polyimido-base insulating tape 203 7.5 mm in width, 280 mm in length, and 200 μm thick was attached to one side on a light reception face side opposed to a conductive foil body on the back surface side at the end of the solar cell element 201.

Thereafter, a carbon coat wire having a carbon paste coated in advance on a copper wire of φ100 μm was formed on the solar cell element 201 and the insulating adhesive tape 203 in pitches of 5.6 mm, whereby an electric collecting electrode 202 was formed.

Further, a bus bar electrode 204 for further collecting electricity collected by an electric collecting electrode 202 was formed at the upper part of the insulating adhesive tape 203. The bus bar electrode 204 was loaded on the insulating tape by employing a silver plating copper foil 5 mm in width, 285 mm in length, and 100 μm thick and then was formed by heat and pressure fixing concurrently with a wire electrode under a condition of 200° C., 3 kgf/cm² (2.94×10⁵ Pa), 180 seconds. At this time, as shown in FIG. 2, one side of the bus bar electrode 204 was designed so as to extend outside the solar cell element 201.

Next, as illustrated, an extension portion 207 of the bus bar electrode 204 extended from the solar cell element 201 was hidden beneath the back surface side of the adjacent solar cell element and was soldered with a back surface side electrode 205 consisting of a soft copper foil on the back surface side. In the figure, although a serial body of three solar electronic elements was schematically shown, five solar cell elements are actually connected in series. Next, a by-pass diode 206, as shown in FIG. 2, was disposed on the back surface side of the solar cell element 201 and was connected in reverse parallel to the solar cell element 201 as shown in FIG. 5A. As the by-pass diode 206, mesa-type silicon chip diodes were sandwiched by two copper foils (not shown), were secured by soldering, and were used. A copper foil connected to the P side of the chip diode was connected to the back surface side electrode 205, a copper foil connected to the N side of the chip diode was connected to the bus bar electrode 204 by solder, and electric conduction was ensured. One by-pass diode 206 was connected to one solar cell element.

Next, a serial body of these five solar cell elements was resin-encapsulated (laminated). The procedure will be shown below.

A serial body of five solar cell elements; EVA (ethylenevinyl acetate copolymer sheet (460 micrometers in thickness); an organic non-woven fabric; a non-oriented ETFE (polyethylene tetrafluoroethylene) film (50 micrometers in thickness) in which one face was plasma-discharged; polyethylene terephthalate (PET) film (50 micrometers in thickness); and a galvanium steel plate (0.4 mm in thickness) were laminated in order of ETFE/EVA/organic unwoven cloth/serial body of five solar cell elements/EVA/PET/EVA/ GALVALUME steel plate. Next, a stainless mesh (40×40 mesh, wire diameter of 0.15 mm) was arranged on the outside of the ETFE via a mold releasing teflon film (50 μm in thickness). While a laminate was subjected to pressure-deaeration and degassing by employing a vacuum laminating apparatus, the solar cell module was obtained by heat welding at 150° C. for 30 minutes. Unevenness with difference of height of 30 μm at maximum was formed on the surface coat material surface by means of a mesh. An output terminal was placed in advance on the back surface of the solar cell element, so that an output was taken out from a terminal exit prepared by drilling a hole at the PET portion. A solar cell module created by the above process is called solar cell module A. Five such solar cell modules were prepared.

The following solar cell modules were prepared for the purpose of comparing characteristics.

Solar Cell Module B

A solar cell module B was prepared in a method similar to solar cell module A except that only one portion was not soldered intentionally after the extension portion 207 of the bus bar 204 had been soldered with the back surface side of the solar cell element in comparison with the solar cell module A. Five such solar cell modules were prepared.

Solar Cell Module C

A solar cell module C was prepared in a method similar to the solar cell module A expect that only one portion was not soldered intentionally after a copper foil connected to the O side of the chip diode of the by-pass diode has been soldered with the back surface side element 205 in comparison with the solar cell module A. Five such solar cell modules were prepared.

Solar Cell Module D

A solar cell module D was prepared in a method similar to the solar cell module A except that a parallel body consisting of two by-pass diodes as shown in FIG. 5B was connected to one solar cell element in comparison with the above solar cell module A. That is, 10 by-pass diodes were connected to one solar cell module. Five such solar cell modules were prepared.

Solar Cell Module E

A solar cell module E was prepared in a method similar to the solar cell module D expect that a copper coil on the P side of the chip diode of an arbitrary by-pass diode was not soldered intentionally to a back surface side electrode 205 after 10 by-pass diodes have been prepared. Five such solar cell modules were prepared. The following inspections were implemented for the above solar cell modules A to E.

INSPECTION 1

A constant current of 5.0 A was supplied in the forward direction of the solar cell element 201 of the solar cell module by employing a circuit shown in FIG. 1B, and the voltages on both ends of the solar cell module at this time were measured by means of a voltmeter. A load of 100 kgf/m$^2$ (9.81×10$^2$ Pa) was applied from the light reception face side after an end in the longitudinal direction of the solar cell module had been fixed. At this time, the maximum deflection of the solar cell module was 1.2 cm. Measurement was carried out at 25° C. in a dark room in order to prevent the effects of light irradiation. As to judgment of acceptable/defective, a solar cell module was judged to be acceptable when the voltage was within the range of 9.5 V to 10.5 V while a current of 5.0 A was supplied, and any other solar cell module was judged to be defective. A solar cell module that was completely disconnected or failed was not conductive, and thus, such a faulty module was judged to be defective.

INSPECTION 2

A constant voltage of 10.0 V was applied in the forward direction of the solar cell element 201 of the solar cell module by employing a circuit shown in FIG. 1B, and a current supplied to the module at this time was measured by means of an ammeter. A load of 100 kgf/m$^2$ (9.81×10$^2$ Pa) was applied from the light reception free face side after an end in the longitudinal direction of the solar cell module had been fixed. At this time, the maximum amount of deflection of the solar cell module was 1.2 cm. Measurement was carried out at 25° C. in a dark room in order to prevent the effects of light irradiation. As to judgment of acceptable/defective, a solar cell module was judged to be acceptable when a current during application of 10 V was in the range of 4.8 A to 5.2 A, and any other solar cell module was judged to be defective.

INSPECTION 3

The polarity of the power source of the circuit shown in FIG. 1B was connected in reverse, and a constant current of 2.0 A was supplied in the forward direction (reverse direction with respect to solar cell elements) of the by-pass diode (not shown) of the solar cell module and was left for one minute. Then, a temperature at a portion at which the by-pass diode would be positioned was measured from the light reception face side of the solar cell module by means of a radiation thermometer. A load of 100 kgf/m$^2$ (9.81×10$^2$ Pa) was applied from the light receptive free face side after an end in the longitudinal direction of the solar cell module had been fixed. The maximum amount of deflection of the solar cell module at this time was 1.2 cm. Measurement was carried out at 25° C. in a dark room in order to prevent an effect of light irradiation. As to measurement of acceptable/defective, it was judged to be acceptable when all of the temperatures measured by a radiation thermometer were 40° C. or above, and if only one by-pass diode of 40° C. existed, such a solar cell module was judged to be defective. A solar cell module that was disconnected or failed was not conductive, and thus such a faulty module was judged to be defective.

INSPECTION 4

A light of 200 lux was emitted to the solar cell module by means of a fluorescent light 303 employing the circuit shown in FIG. 3, and the voltages at both ends of the solar cell module at this time were measured by means of the voltmeter. A load of 100 kgf/m$^2$ (9.81×10$^2$ Pa) was applied from the light reception free face side after an end in the longitudinal direction of the solar cell module had been fixed. At this time, the maximum amount of deflection of the solar cell module was 1.2 cm. Measurement was carried out at 25° C. in a dark room. As to measurement of acceptable/defective, the solar cell module was judged to be acceptable when the generated voltage was within the range of 4.5 V to 5.5 V, and any other solar cell module was judged to be defective. When the solar cell module was disconnected or failed, the generated voltage was set to 0, and thus, it was judged to be defective.

INSPECTION 5

Figure 4:
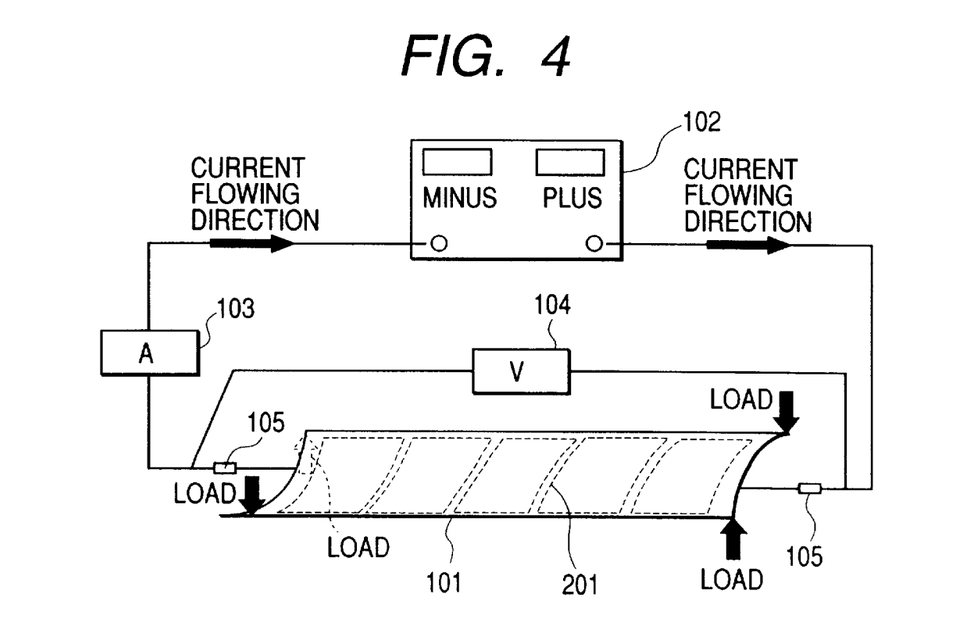
FIG. 4 is a schematic view illustrating another example of the inspection method using a torsional load of the present invention.

This inspection was carried out in a method completely similar to that in inspection 1 except that a torsional load was applied. A lookout in which such torsional load is applied is shown in FIG. 4. A load of 100 kgf/m$^2$ (9.81×10$^2$ Pa) was applied at four corners of the solar cell module, as indicated by the arrow.

INSPECTION 6

The polarity of the circuit shown in FIG. 1B was connected in opposite, a constant current of 2.0 A was supplied in the forward direction (reverse direction with respect to the solar cell element) of the by-pass diode (not shown) of the solar cell module, and the voltages at both ends of the solar cell module at this time were measured by means of a voltmeter. A load of 100 kgf/m$^2$ (9.81×10$^2$ Pa) was applied from the light reception free face side after an end in the longitudinal direction of the solar cell module had been fixed. At this time, the minimum amount of deflection of the solar cell module was 1.2 cm. Measurement was carried out at 25° C. in a dark room in order to prevent the effects of light irradiation. As to judgment of acceptable/defective, a solar cell module was judged to be acceptable when the voltages at both ends during electric conduction of 2.0 A was within the range of 4.5 V to 5.5 V, and any other solar cell module was judged to be defective. A solar cell module that was completely disconnected or failed was not conducting, and thus, such a faulty module was judged to be defective.

Comparative Inspection 1

This comparative inspection was carried out in a method completely similar to inspection 1 expect that no load was applied.

Comparative Inspection 2

This comparative inspection was carried out in a method completely similar to inspection 2 expect that no load was applied.

Comparative Inspection 3

This comparative inspection was carried out in a method completely similar to inspection 3 expect that no load was applied.

Comparative Inspection 4

This comparative inspection was carried out in a method completely similar to inspection 4 expect that no load was applied.

Comparative Inspection 5

This comparative inspection was carried out in a method completely similar to inspection 6 expect that no load was applied.

The inspection result is shown in Table 1.

From Table 1, although judged to be acceptable in comparative inspections 1 to 5, plenty of solar cell modules were judged to be defective in inspections 1 to 5, and the inspection method according to the present invention was found to be a method capable of detecting failures of an electric wiring route more precisely. In addition, when attention is paid to solar cell modules E1 to E5, only inspection 3 can be judged to be defective. From the foregoing, it was found that inspections due to temperature measurement are effective in particular in a parallel circuit. Further, when attention is paid to solar cell module B5, although it was judged to be acceptable in inspection 1, it was judged to be defective in inspection 5. Among various loads, applying a torsional load is found to be very effective.

As has been described above, according to the present invention, there can be achieved a solar cell module inspection method capable of more precisely judging failures on an electric wiring route in the solar cell module.

In addition, according to the present invention, a configuration in which a load is applied to an extent such that the deformation or deflection remains within an elastic limit is adopted for the solar cell module, thereby making it possible to detect a change in a contact area using an amount of deflection at a site at which a connection failure occurs or a non-contact portion. In this manner, a connection failure that cannot be detected conventionally or the like can be detected. Characteristics such as a voltage generated when a current is supplied in the forward direction of diodes such as a solar cell element or bypass diode or a current generated when a voltage was applied in the forward direction of diodes were measured, thereby making it possible to detect connection failures or the like.

Further, according to the present invention, a produced temperature of diodes when a current was supplied in the forward direction of diodes such as solar cell elements or by-pass diodes was measured, thereby making it possible to detect such connection failures that can hardly be detected during voltage measurement or the like.

Furthermore, according to the present invention, when using a torsional load as the load, a change in contact area for a site at which a connection failure or a non-contact state occurs is made more significant, and judgment of failures can be measured with higher sensitivity.

Moreover, according to the present invention, a load is applied from the light receptive free face side of the solar cell module, whereby inspection can be carried out without damaging the light receptive face side.

Still moreover, according to the present invention, the voltage generated by irradiating the solar cell module with light is detected, making it possible to perform inspection.

TABLE 1

| Solar Cell Module No. | Inspection 1 | | Inspection 2 | | Inspection 3 | |
|---|---|---|---|---|---|---|
| | Measured Value | Judgement | Measured Value | Judgement | Measured Value | Judgement |
| A1 | 9.8 | Acceptable | 5.0 | Acceptable | All 40° C. or more | Acceptable |
| A2 | 9.9 | Acceptable | 5.0 | Acceptable | All 40° C. or more | Acceptable |
| A3 | 9.9 | Acceptable | 5.0 | Acceptable | All 40° C. or more | Acceptable |
| A4 | 10.0 | Acceptable | 5.0 | Acceptable | All 40° C. or more | Acceptable |
| A5 | 10.0 | Acceptable | 5.0 | Acceptable | All 40° C. or more | Acceptable |
| B1 | No conduction | Defective | 0 | Defective | No conduction | Defective |
| B2 | No conduction | Defective | 0 | Defective | No conduction | Defective |
| B3 | No conduction | Defective | 0 | Defective | No conduction | Defective |
| B4 | No conduction | Defective | 0 | Defective | No conduction | Defective |
| B5 | 10.2 | Acceptable | 4.6 | Acceptable | All 40° C. or more | Acceptable |
| C1 | 10.0 | Acceptable | 5.0 | Acceptable | No conduction | Defective |
| C2 | 10.0 | Acceptable | 5.0 | Acceptable | No conduction | Defective |
| C3 | 10.1 | Acceptable | 5.0 | Acceptable | No conduction | Defective |
| C4 | 10.0 | Acceptable | 5.0 | Acceptable | No conduction | Defective |
| C5 | 9.9 | Acceptable | 5.0 | Acceptable | No conduction | Defective |
| D1 | 9.9 | Acceptable | 5.0 | Acceptable | All 40° C. or more | Acceptable |
| D2 | 9.9 | Acceptable | 5.0 | Acceptable | All 40° C. or more | Acceptable |
| D3 | 9.9 | Acceptable | 5.0 | Acceptable | All 40° C. or more | Acceptable |
| D4 | 9.9 | Acceptable | 5.0 | Acceptable | All 40° C. or more | Acceptable |
| D5 | 10.0 | Acceptable | 5.0 | Acceptable | All 40° C. or more | Acceptable |
| E1 | 9.8 | Acceptable | 5.0 | Acceptable | Only one 25° C. | Defective |
| E2 | 9.9 | Acceptable | 5.0 | Acceptable | Only one 25° C. | Defective |
| E3 | 9.8 | Acceptable | 5.0 | Acceptable | Only one 25° C. | Defective |
| E4 | 10.0 | Acceptable | 5.0 | Acceptable | Only one 25° C. | Defective |
| E5 | 10.0 | Acceptable | 5.0 | Acceptable | Only one 25° C. | Defective |

| Solar Cell Module No. | Insepection 4 | | Inspection 5 | | Inspection 6 | |
|---|---|---|---|---|---|---|
| | Measured Value | Judgement | Measured Value | Judgement | Measured Value | Judgement |

TABLE 1-continued

| Solar Cell Module No. | | | | | | |
|---|---|---|---|---|---|---|
| A1 | 5.0 | Acceptable | 9.8 | Acceptable | 5.0 | Acceptable |
| A2 | 5.1 | Acceptable | 9.9 | Acceptable | 5.0 | Acceptable |
| A3 | 4.9 | Acceptable | 9.8 | Acceptable | 5.0 | Acceptable |
| A4 | 4.9 | Acceptable | 10.0 | Acceptable | 5.0 | Acceptable |
| A5 | 5.1 | Acceptable | 10.0 | Acceptable | 5.0 | Acceptable |
| B1 | 0.0 | Defective | No conduction | Defective | No conduction | Defective |
| B2 | 0.0 | Defective | No conduction | Defective | No conduction | Defective |
| B3 | 0.0 | Defective | No conduction | Defective | No conduction | Defective |
| B4 | 0.0 | Defective | No conduction | Defective | No conduction | Defective |
| B5 | 5.1 | Acceptable | No conduction | Defective | 5.1 | Acceptable |
| C1 | 5.1 | Acceptable | 10.0 | Acceptable | No conduction | Defective |
| C2 | 5.0 | Acceptable | 10.0 | Acceptable | No conduction | Defective |
| C3 | 5.0 | Acceptable | 10.1 | Acceptable | No conduction | Defective |
| C4 | 5.0 | Acceptable | 10.0 | Acceptable | No conduction | Defective |
| C5 | 5.1 | Acceptable | 9.9 | Acceptable | No conduction | Defective |
| D1 | 5.0 | Acceptable | 9.9 | Acceptable | 5.0 | Acceptable |
| D2 | 5.0 | Acceptable | 9.9 | Acceptable | 5.0 | Acceptable |
| D3 | 4.9 | Acceptable | 10 | Acceptable | 5.0 | Acceptable |
| D4 | 5.1 | Acceptable | 9.9 | Acceptable | 5.0 | Acceptable |
| D5 | 5.1 | Acceptable | 10 | Acceptable | 5.0 | Acceptable |
| E1 | 5.1 | Acceptable | 9.8 | Acceptable | 5.0 | Defective |
| E2 | 5.0 | Acceptable | 9.9 | Acceptable | 5.0 | Defective |
| E3 | 5.0 | Acceptable | 9.8 | Acceptable | 5.0 | Defective |
| E4 | 5.0 | Acceptable | 10.0 | Acceptable | 5.0 | Defective |
| E5 | 5.1 | Acceptable | 10.0 | Acceptable | 5.0 | Defective |

| Solar Cell Module No. | Comparative Insepection 1 | | Comparative Inspection 2 | | Comparative Inspection 3 | |
|---|---|---|---|---|---|---|
| | Measured Value | Judgement | Measured Value | Judgement | Measured Value | Judgement |
| A1 | 9.8 | Acceptable | 5.0 | Acceptable | All 40° C. or more | Acceptable |
| A2 | 9.9 | Acceptable | 5.0 | Acceptable | All 40° C. or more | Acceptable |
| A3 | 9.8 | Acceptable | 5.0 | Acceptable | All 40° C. or more | Acceptable |
| A4 | 10.0 | Acceptable | 5.0 | Acceptable | All 40° C. or more | Acceptable |
| A5 | 10.0 | Acceptable | 5.0 | Acceptable | All 40° C. or more | Acceptable |
| B1 | 10.1 | Acceptable | 5.0 | Acceptable | All 40° C. or more | Acceptable |
| B2 | 10.7 | Defective | 4.2 | Defective | All 40° C. or more | Acceptable |
| B3 | 9.9 | Acceptable | 5.0 | Acceptable | All 40° C. or more | Acceptable |
| B4 | 10.0 | Acceptable | 5.1 | Acceptable | All 40° C. or more | Acceptable |
| B5 | 10.2 | Acceptable | 4.8 | Acceptable | All 40° C. or more | Acceptable |
| C1 | 10.0 | Acceptable | 5.0 | Acceptable | All 40° C. or more | Acceptable |
| C2 | 10.0 | Acceptable | 5.0 | Acceptable | All 40° C. or more | Acceptable |
| C3 | 10.1 | Acceptable | 5.0 | Acceptable | All 40° C. or more | Acceptable |
| C4 | 10.0 | Acceptable | 5.0 | Acceptable | All 40° C. or more | Acceptable |
| C5 | 9.9 | Acceptable | 5.0 | Acceptable | All 40° C. or more | Acceptable |
| D1 | 9.9 | Acceptable | 5.0 | Acceptable | All 40° C. or more | Acceptable |
| D2 | 9.9 | Acceptable | 5.0 | Acceptable | All 40° C. or more | Acceptable |
| D3 | 9.9 | Acceptable | 5.0 | Acceptable | All 40° C. or more | Acceptable |
| D4 | 9.9 | Acceptable | 5.0 | Acceptable | All 40° C. or more | Acceptable |
| D5 | 10.0 | Acceptable | 5.0 | Acceptable | All 40° C. or more | Acceptable |
| E1 | 9.8 | Acceptable | 5.0 | Acceptable | All 40° C. or more | Acceptable |
| E2 | 9.9 | Acceptable | 5.0 | Acceptable | All 40° C. or more | Acceptable |
| E3 | 9.8 | Acceptable | 5.0 | Acceptable | All 40° C. or more | Acceptable |
| E4 | 10.0 | Acceptable | 5.0 | Acceptable | All 40° C. or more | Acceptable |
| E5 | 10.0 | Acceptable | 5.0 | Acceptable | All 40° C. or more | Acceptable |

| Solar Cell Module No. | Comparative Insepection 4 | | Comparative Inspection 5 | |
|---|---|---|---|---|
| | Measured Value | Judgement | Measured Value | Judgement |
| A1 | 5.0 | Acceptable | 5.0 | Acceptable |
| A2 | 5.1 | Acceptable | 5.0 | Acceptable |
| A3 | 4.9 | Acceptable | 5.0 | Acceptable |
| A4 | 4.9 | Acceptable | 5.0 | Acceptable |
| A5 | 5.1 | Acceptable | 5.0 | Acceptable |
| B1 | 4.9 | Acceptable | 5.1 | Acceptable |
| B2 | 4.8 | Acceptable | 5.0 | Acceptable |
| B3 | 4.9 | Acceptable | 5.0 | Acceptable |
| B4 | 4.9 | Acceptable | 5.0 | Acceptable |
| B5 | 4.9 | Acceptable | 5.1 | Acceptable |
| C1 | 5.1 | Acceptable | 5.1 | Acceptable |
| C2 | 5.0 | Acceptable | 5.0 | Acceptable |
| C3 | 5.0 | Acceptable | 5.0 | Acceptable |
| C4 | 5.0 | Acceptable | 5.0 | Acceptable |
| C5 | 5.1 | Acceptable | 5.0 | Acceptable |

TABLE 1-continued

| D1 | 5.0 | Acceptable | 5.1 | Acceptable |
| D2 | 5.0 | Acceptable | 5.0 | Acceptable |
| D3 | 4.9 | Acceptable | 5.0 | Acceptable |
| D4 | 5.1 | Acceptable | 5.0 | Acceptable |
| D5 | 5.1 | Acceptable | 5.0 | Acceptable |
| E1 | 5.1 | Acceptable | 5.0 | Acceptable |
| E2 | 5.0 | Acceptable | 5.0 | Acceptable |
| E3 | 5.0 | Acceptable | 5.0 | Acceptable |
| E4 | 5.0 | Acceptable | 5.0 | Acceptable |
| E5 | 5.1 | Acceptable | 5.0 | Acceptable |

What is claimed is:

1. A method of inspecting an electrical wiring route of a solar cell module comprising a solar cell element, which comprises the step of inspecting an electrical wiring route of a solar cell module while applying a load to the solar cell module such that the solar cell module generates a deformation or distortion.

2. The method according to claim 1, wherein the solar cell module is encapsulated with a resin.

3. The method according to claim 1, wherein the deformation or distortion does not exceed an elastic limit of the solar cell module.

4. The method according to claim 1, wherein the load is a torsional load.

5. The method according to claim 1, wherein the load is applied to the non-light-incident surface side of the solar cell module.

6. The method according to claim 1, wherein the step of inspection comprises measuring a voltage across the solar cell module while causing a current to flow in the forward direction through the solar cell element.

7. The method according to claim 1, wherein the step of inspection comprises measuring a current flowing through the solar cell module while applying a voltage in the forward direction across the solar cell element.

8. The method according to claim 1, wherein the step of inspection comprises measuring the temperature of the solar cell element while causing a current to flow in the forward direction through the solar cell element.

9. The method according to claim 1, wherein the solar cell module comprises a by-pass diode in a part of the electrical wiring route.

10. The method according to claim 9, comprising measuring a voltage across the solar cell module while causing a current to flow in the forward direction through the by-pass diode.

11. The method according to claim 9, comprising measuring a current flowing through the solar cell module while applying a voltage in the forward direction across the by-pass diode.

12. The method according to claim 9, comprising measuring the temperature of the by-pass diode while causing a current to flow in the forward direction through the by-pass diode.

13. The method according to claim 1, wherein the step of inspection comprises irradiating the solar cell module with a light and measuring a voltage or current generated in the solar cell module.

14. A method of producing a solar cell module comprising a solar cell element, which comprises the steps of providing a solar cell module and inspecting an electrical wiring route of the solar cell module while applying a load to the solar cell module such that the solar cell module generates a deformation or distortion.

15. The method according to claim 14, further comprising before the step of inspection, a step of encapsulating the solar cell module with a resin.

16. The method according to claim 14, wherein the deformation or distortion does not exceed an elastic limit of the solar cell module.

17. The method according to claim 14, wherein the load is a torsional load.

18. The method according to claim 14, wherein the load is applied to the non-light-incident surface side of the solar cell module.

19. The method according to claim 14, wherein the step of inspection comprises measuring a voltage across the solar cell module while causing a current to flow in the forward direction through the solar cell element.

20. The method according to claim 14, wherein the step of inspection comprises measuring a current flowing through the solar cell module while applying a voltage in the forward direction across the solar cell element.

21. The method according to claim 14, wherein the step of inspection comprises measuring the temperature of the solar cell element while causing a current to flow in the forward direction through the solar cell element.

22. The method according to claim 14, wherein the solar cell module comprises a by-pass diode in a part of the electrical wiring route.

23. The method according to claim 22, comprising measuring a voltage across the solar cell module while causing a current to flow in the forward direction through the by-pass diode.

24. The method according to claim 22, comprising measuring a current flowing through the solar cell module while applying a voltage in the forward direction across the by-pass diode.

25. The method according to claim 22, comprising measuring the temperature of the by-pass diode while causing a current to flow in the forward direction through the by-pass diode.

26. The method according to claim 14, wherein the step of inspection comprises irradiating the solar cell module with a light and measuring a voltage or current generated in the solar cell module.

* * * * *

UNITED STATES PATENT AND TRADEMARK OFFICE
CERTIFICATE OF CORRECTION

PATENT NO.     : 6,271,462 B1
DATED          : August 7, 2001
INVENTOR(S)    : Koji Tsuzuki et al.

It is certified that error appears in the above-identified patent and that said Letters Patent is hereby corrected as shown below:

Column 2,
Line 7, "a surface member 207" should read -- an extension portion 207 --;
Line 12, "surface member 207," should read -- extension portion 207, --; and
Line 49, "expansion" should read -- extension --.

Column 8,
Line 21, "acetate" should read -- acetate) --.

Column 10,
Lines 56, 61 and 66, "expect" should read -- except --.

Column 11,
Lines 3 and 9, "expect" should read -- except --.

Column 12,
Table 1, "9.9" (second occurrence) should read -- 9.8 --.

Signed and Sealed this

Eighteenth Day of June, 2002

Attest:

Attesting Officer

JAMES E. ROGAN
*Director of the United States Patent and Trademark Office*